(12) United States Patent
Liu et al.

(10) Patent No.: US 7,515,015 B2
(45) Date of Patent: Apr. 7, 2009

(54) HIGH SPEED SIGNAL TRANSMISSION STRUCTURE

(75) Inventors: Ning Liu, Shenzhen (CN); Yu-Hsu Lin, San Jose, CA (US); Yun-Qiang Meng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 52 days.

(21) Appl. No.: 11/560,850

(22) Filed: Nov. 17, 2006

(65) Prior Publication Data
US 2007/0229184 A1 Oct. 4, 2007

(51) Int. Cl.
H01P 1/04 (2006.01)
H01P 3/08 (2006.01)
H04B 3/32 (2006.01)

(52) U.S. Cl. ..................... 333/24 C; 333/236; 333/238

(58) Field of Classification Search ............... 333/24 C, 333/12, 138, 140, 156, 161, 32, 34, 245, 333/236, 238
See application file for complete search history.

(56) References Cited

U.S. PATENT DOCUMENTS 6,710,255 B2 * 3/2004 Ross et al. .................. 174/255
6,873,179 B2    3/2005 Takekuma et al.

* cited by examiner

*Primary Examiner*—Dean O Takaoka
(74) *Attorney, Agent, or Firm*—Wei Te Chung

(57) ABSTRACT

A signal transmission structure includes a driving circuit block, a receiving circuit block, a main transmission line, and a copper patch. The main transmission line connects the driving circuit block to the receiving circuit block for transmitting signals therebetween. The copper patch is arranged at the main transmission line, and has a rectangular shape. The copper patch can reduce switching rates when the signal state of the driving circuit changes rapidly. The copper patch serves as a compensation capacitor, to reduce a rate of switching of the signal, and to reduce or even eliminate the problems of crosstalk and overshooting and undershooting of signals. It is of advantage that the copper patch is simple to manufacture and very suitable for mass production.

7 Claims, 5 Drawing Sheets

HIGH SPEED SIGNAL TRANSMISSION STRUCTURE

BACKGROUND OF THE INVENTION

1. Field of the Invention

The present invention relates to techniques of transmitting electrical signals, and particularly to a high speed signal transmission structure that can maintain signal integrity.

2. Description of Related Art

Mutual capacitance is the coupling of two electric fields, where electrical current proportional to the rate of change of voltage in a driver flows into a target line. The shorter the distance between two electrically conductive objects, the greater their mutual capacitance. Mutual inductance is the concept that the current through one inductor can induce a voltage in another nearby inductor. It is important as the mechanism by which transformers work, but it can also cause unwanted coupling between conductors in a circuit.

Crosstalk is the electrical "noise" caused by mutual inductance and mutual capacitance between signal conductors in close proximity to each other. Crosstalk can cause digital system failure due to false signals appearing on a receiver.

In most circuits, a fast signal rise time is desirable. However, in some circuits, the fast signal rise time can cause reflections and/or electromagnetic interference (EMI) in the circuit, which can adversely affect the circuit's performance. EMI is caused by the rapid change in current as the signal changes between rising and falling states. Signal overshoot and undershoot are also undesired side effects of this rapid change in current.

FIG. 4 shows a conventional high speed signal transmission structure, and FIG. 5 shows an improved signal transmission structure conventionally configured to solve the above-described problems. Referring to FIGS. 4 and 5, a basic conventional signal transmission structure includes a driving circuit block 10, a first receiving circuit block 20, and a second receiving circuit block 30. A main transmission line 40 is connected to the driving circuit block 10, the first receiving circuit block 20 and the second receiving circuit block 30. The driving circuit block 10 includes a driving circuit 12 and a branch transmission line 14. The first receiving circuit block 20 includes a first receiving circuit 22, a branch transmission line 24, and a terminal capacitor 26. The second receiving circuit block 30 includes a second receiving circuit 32, a branch transmission line 34, and a terminal capacitor 36. The difference between the signal transmission structures of FIG. 4 and FIG. 5 is that in the structure of FIG. 5, a compensation capacitor 50 is connected to the main transmission line 40 in order to mitigate the rate of switching of signals. In the case of not having the compensation capacitor 50 (FIG. 4), the driving waveform is attenuated to very low levels due to signal reflection in transmission lines. However, in the case of having the compensation capacitor 50 (FIG. 5), the attenuation is reduced, and the rising time and the falling time are also reduced. Thereby, the switching rate is reduced.

However, employing the capacitor to depress the switching rate increases the cost of the signal transmission structure. What is needed, therefore, is a signal transmission structure, which not only depresses the switching rate and maintains signal integrity, but also can be mass-produced at a reasonable cost.

SUMMARY OF INVENTION

An exemplary transmission structure includes a driving circuit block, a receiving circuit block, a main transmission line, and a copper patch. The main transmission line connects the driving circuit block to the receiving circuit block for transmitting signals therebetween. The copper patch is arranged at the main transmission line, and has a rectangular shape.

The copper patch serves as a compensation capacitor, to reduce a rate of switching of signals, and to reduce or even eliminate the problems of crosstalk and overshooting and undershooting of signals. It is of advantage that the copper patch is simple to manufacture and very suitable for mass production.

Other advantages and novel features will become more apparent from the following detailed description when taken in conjunction with the accompanying drawings, in which:

DETAILED DESCRIPTION

Figure 1:
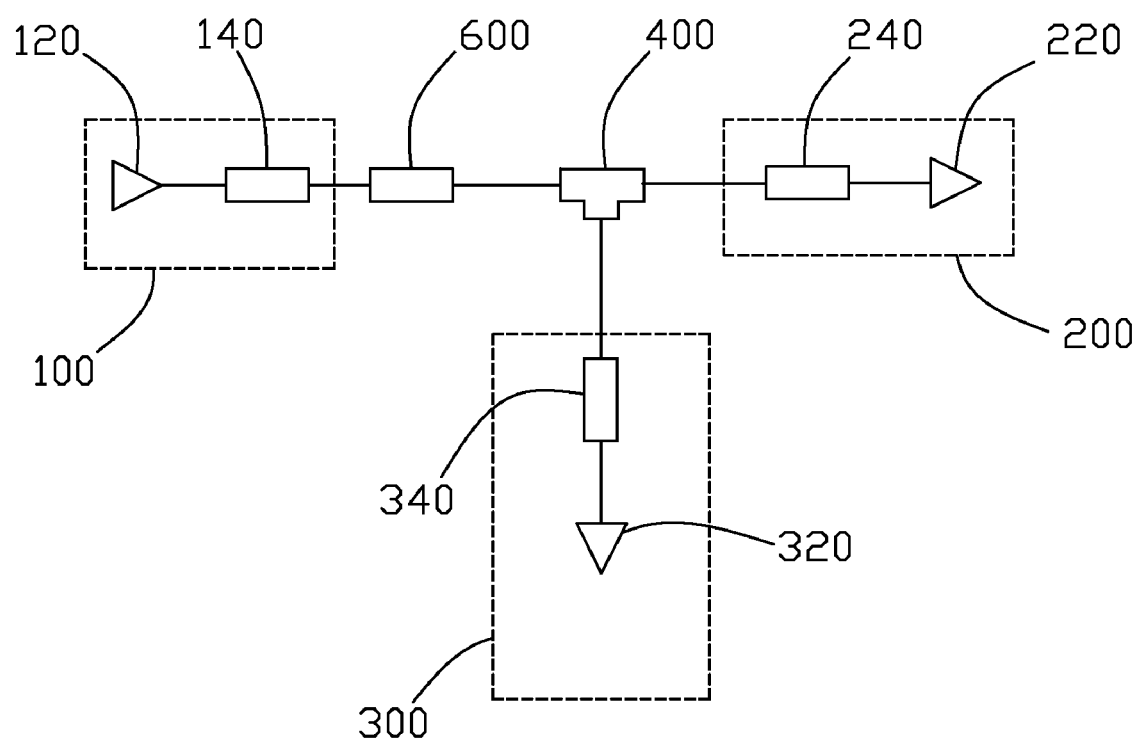
FIG. 1 is a circuit diagram of a signal transmission structure in accordance with a preferred embodiment of the preset invention.

Referring to FIG. 1, a signal transmission structure in accordance with a preferred embodiment of the present invention includes a driving circuit block 100, a first receiving circuit block 200, and a second receiving circuit block 300. A main transmission line 400 connects to the driving circuit block 100, the first receiving circuit block 200, and the second receiving circuit block 300. The driving circuit block 100 includes a driving circuit 120 and a branch transmission line 140. The first receiving circuit block 200 includes a first receiving circuit 220, and a branch transmission line 240. The second receiving circuit block 300 includes a second receiving circuit 320, and a branch transmission line 340. The main transmission line 400 serves a main transmission function, and the branch transmission lines 140, 240, 340 serve signal transmission functions within circuit blocks 100, 200, 300 respectively. A copper patch 600 having a generally rectangular shape is located at the main transmission line 400. The copper patch 600 is an enlarged section of the main transmission line 400, and has a capacitor characteristic. The main transmission line 400 together with the copper patch 600 is manufactured by patching copper onto a printed circuit board (PCB) using a metal-etching process. The width of the copper patch 600 is greater than that of the main transmission line 400. Making the copper patch 600 requires little or no extra costs, and is thus very suitable for mass production.

Figure 2:
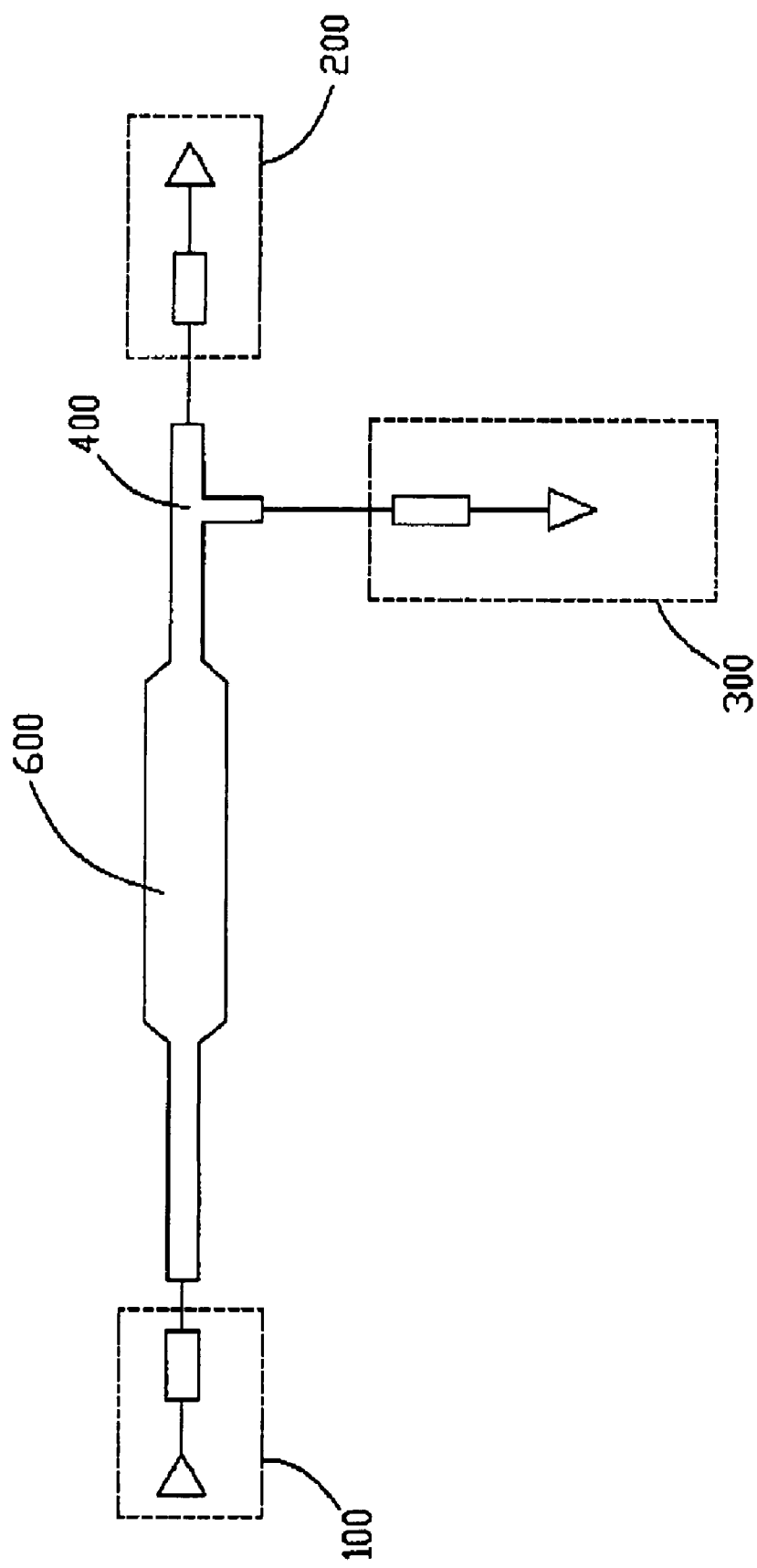
FIG. 2 is a schematic view of a copper patch and adjoining portions of the signal transmission structure of FIG. 1.

FIG. 2 shows a schematic view of the copper patch 600 and adjoining portions of the signal transmission structure of FIG 1. The capacitance of the copper patch 600 can be approximated as follows:

$$C = \frac{\varepsilon S}{4k\pi d}; \quad (1)$$

wherein C denotes the capacitance of the copper patch 600, ∈ denotes the permittivity of free space, and is a constant equal to 4.2, S denotes an area of the copper patch 600, k is the (dimensionless) dielectric constant, and is equal to 9.00×10⁹ N*m2/C2, and d denotes a thickness of a dielectric layer of the PCB, and in this embodiment d is equal to 1.07*10-3 m. It can be seen that the capacitance of the copper patch 600 is directly proportional to the area of the copper patch 600. If a 20 pF capacitance is needed, the area of the copper patch 600 can be calculated by the follows:

$$S = \frac{4k\pi dC}{\varepsilon} \quad (2)$$

It can be seen that the area of the copper patch 600 is preferably at least 60 mm2. In this preferred embodiment of the present invention, a length of the copper patch 600 is 50 mm, and a width is 1.2 mm. A smooth transition from the main transmission line 400 to the copper patch 600 is obtained by cutting corners of the rectangle away.

Referring to FIG. 1, it is assumed that the capacitance of the copper patch 600 is 20 pF. Further, for the purposes of obtaining data, a simulated performance of the signal transmission structure with the driving circuit block 120 emitting a 1V signal was done. The first receiving circuit 220, the second receiving circuit 320, the main transmission line 400, and the branch transmission lines 140, 240, 340 are similar to components shown in the signal transmission structure of FIG. 4 (related art), both in terms of individual structure and in terms of mechanical and electrical interrelationships.

Figure 3:
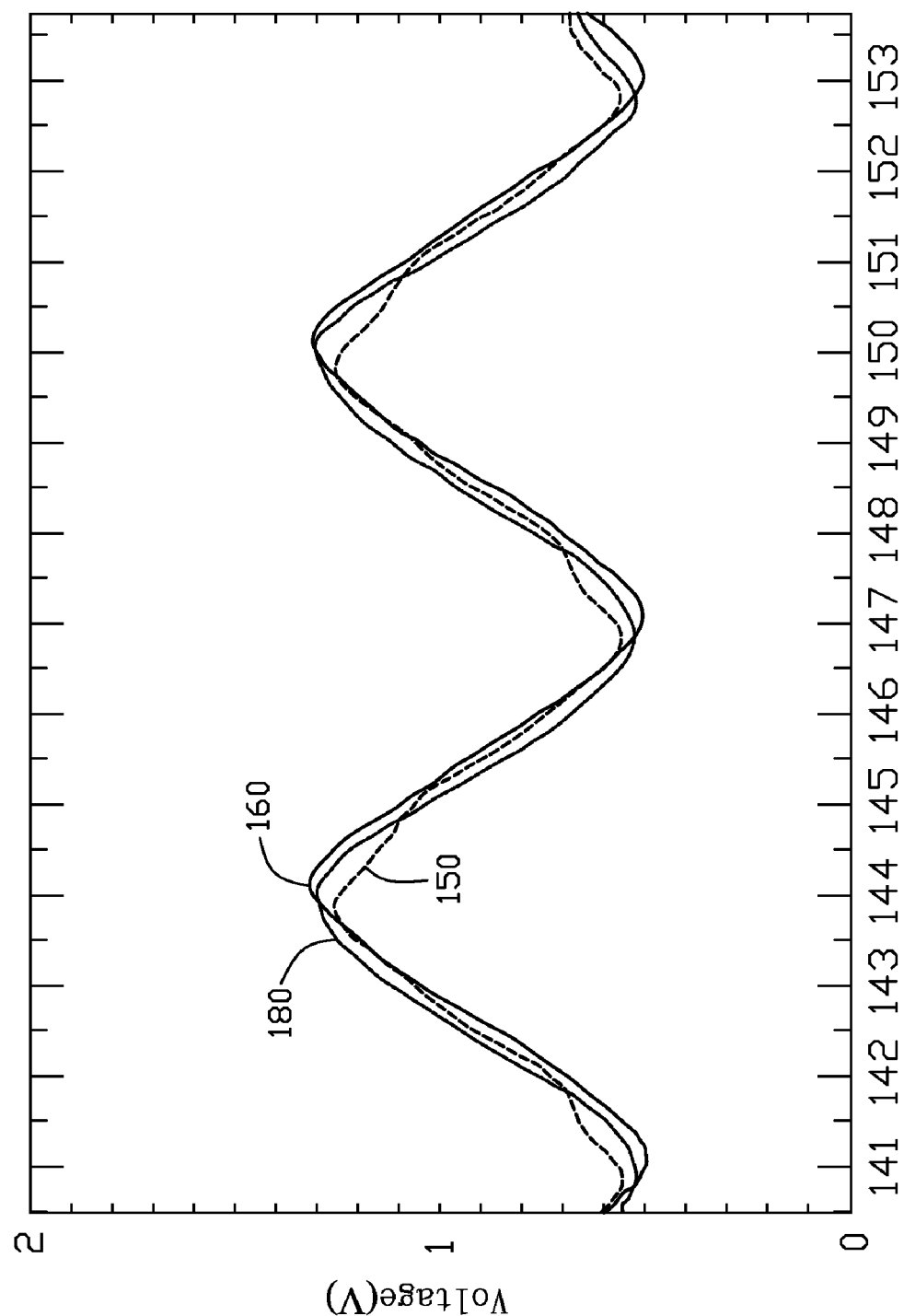
FIG. 3 is a graph showing signal waveforms obtained using the signal transmission structures of FIGS. 1, 4, and 5.
Figure 4:
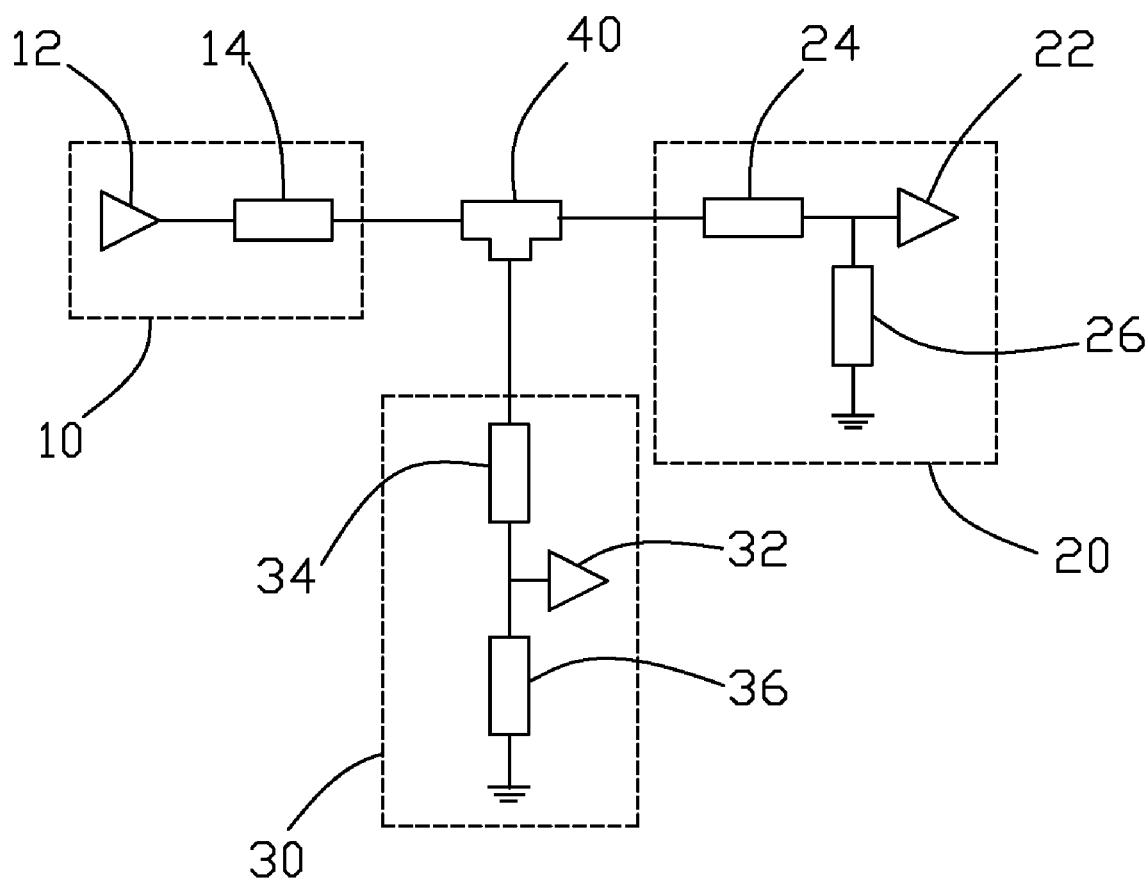
FIG. 4 is a circuit diagram of a conventional signal transmission structure.
Figure 5:
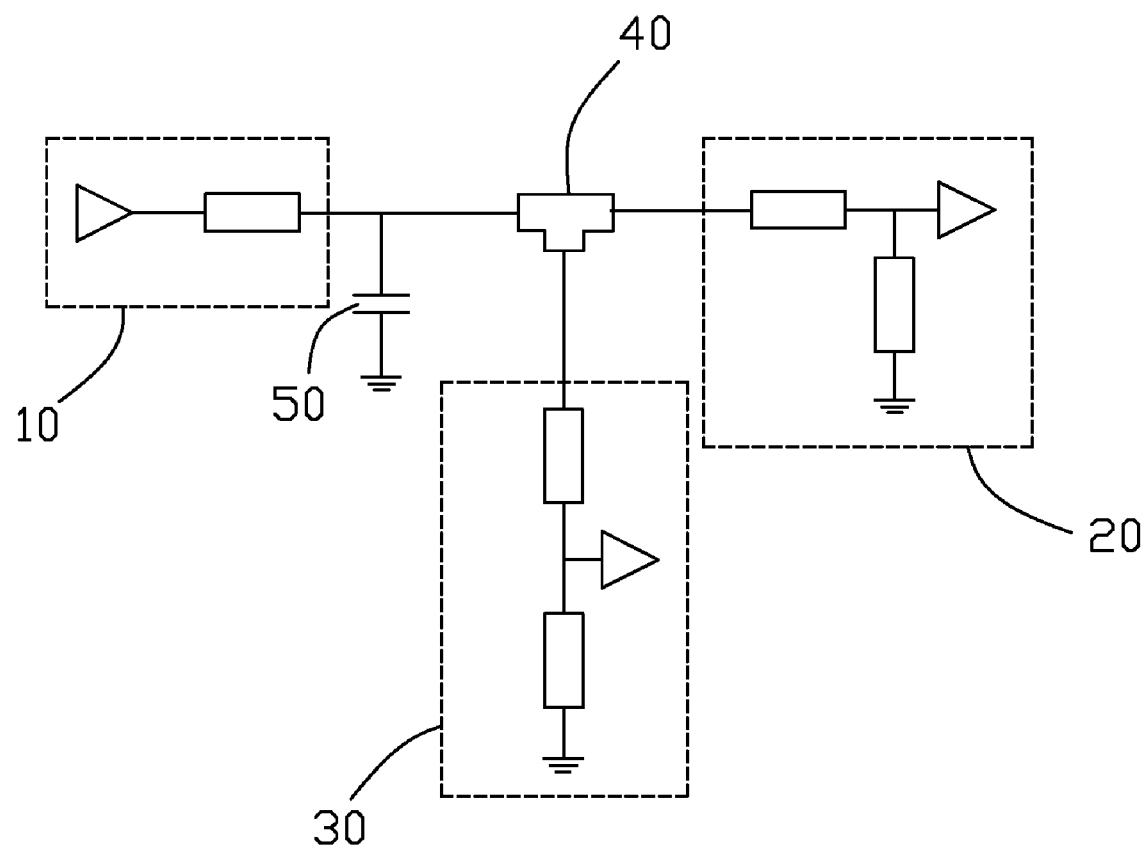
FIG. 5 is a circuit diagram of another conventional signal transmission structure.

FIG. 3 is a graph comparing waveforms depicted by curves 160, 180, and 150 using the circuits of the preferred embodiment of FIG. 1, the conventional signal transmission structure of FIG. 5, and the conventional signal transmission structure of FIG. 4 respectively. As shown in FIG. 3, the curves 160, 180 are nearly superimposed upon each other. That is, the copper patch 600 of the embodiment of the present invention has the same effect as the conventional compensation capacitor 50 in reducing signal attenuation. And the curve 150 shows that both of the structures used for the curves 160, 180 outperform the convention structure not using some form of compensation such as a capacitor 50 or the copper patch 600 of the present invention. Moreover, the need for a plurality of terminal capacitors 26 and 36 is reduced using the copper patch 600 thus the production costs in mass-producing the PCBs are reduced.

In the above-described signal transmission structure of the preferred embodiment of the present invention, the driving circuit block 100 can be a north bridge chipset, and the receiving circuit blocks 200, 300 can be memory slots.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A signal transmission structure comprising:
    a driving circuit block;
    a receiving circuit block;
    a main transmission line connecting the driving circuit block to the receiving circuit block for transmitting signals therebetween; and
    a copper patch with a rectangular shape located at the main transmission line serving as a capacitor, for reducing switching rates of the signals; and
    wherein a capacitance of the copper patch and an area of the copper patch are directly proportional to each other, and when the capacitance of the copper patch is 20 pF, the area of the copper patch is at least 60 mm².

2. The signal transmission structure as claimed in claim 1, wherein the driving circuit block comprises a driving circuit and a first branch transmission line, and the first branch transmission line transmits the signals from the driving circuit to the main transmission line.

3. The signal transmission structure as claimed in claim 2, wherein the receiving circuit block comprises a receiving circuit and a second branch transmission line, and the second branch transmission line transmits signals between the main transmission line and the receiving circuit.

4. The signal transmission structure as claimed in claim 1, wherein the copper patch is manufactured by patching copper onto a printed circuit board (PCB), and a width of the copper patch is greater than that of the main transmission line.

5. The signal transmission structure as claimed in claim 4, wherein corners of the copper patch are cut away to obtain a smooth transition from the main transmission line to the copper patch.

6. A printed circuit board (PCB) comprising:
    a driving circuit block, the driving circuit block comprising a driving circuit and a first branch transmission line coupled to the driving circuit;
    at least one receiving circuit block comprising a receiving circuit and a second branch transmission line coupled to the receiving circuit;
    a main transmission line coupling the first branch transmission line and the second branch transmission line, the main transmission line comprising an enlarged section having a rectangular shape, and a width of the enlarged section being greater than that of the other section of the main transmission line; and
    wherein a capacitance of the enlarged section and an area of the enlarged section are directly proportional to each other, and when the capacitance of the enlarged section is 20 pF, the area of the enlarged section at least 60 mm².

7. The PCB as claimed in claim 6, wherein the enlarged section and the main transmission line are etched on the PCB using a metal-etching process.

* * * * *